United States Patent
Brady et al.

[11] Patent Number: 5,239,504
[45] Date of Patent: Aug. 24, 1993

[54] MAGNETOSTRICTIVE/ELECTROSTRICTIVE THIN FILM MEMORY

[75] Inventors: Michael J. Brady, Star Ridge Manor; Stephane S. Dana, New York; Richard J. Gambino, Yorktown Heights, all of N.Y.

[73] Assignee: International Business Machines Corporation, Armonk, N.Y.

[21] Appl. No.: 684,635

[22] Filed: Apr. 12, 1991

[51] Int. Cl.$^5$ .................. G11C 11/00; G11C 13/04; G11C 13/06
[52] U.S. Cl. .................. 365/157; 365/121; 365/122; 365/128
[58] Field of Search ............... 365/121, 122, 128, 157

[56] References Cited

U.S. PATENT DOCUMENTS

| | | | |
|---|---|---|---|
| 3,624,622 | 11/1971 | Dichen | 365/122 |
| 3,739,359 | 6/1973 | Waring, Jr. | 365/122 |
| 3,949,387 | 4/1976 | Chaudhari et al. | 340/174 |
| 4,028,565 | 6/1977 | Davis | 365/157 |
| 4,466,035 | 8/1984 | Connell et al. | 360/114 |
| 4,569,881 | 2/1986 | Freese et al. | 428/213 |
| 4,612,068 | 9/1986 | Tanaka et al. | 148/301 |
| 4,649,519 | 3/1987 | Sun et al. | 365/122 |
| 4,731,754 | 3/1988 | Ogden et al. | 365/121 |
| 4,794,560 | 12/1988 | Bell et al. | 365/122 |
| 4,803,674 | 2/1989 | Nakao et al. | 369/13 |
| 4,832,980 | 5/1989 | Ichihara et al. | 427/38 |
| 4,861,656 | 8/1989 | Uchiyama et al. | 428/333 |

FOREIGN PATENT DOCUMENTS

| | | |
|---|---|---|
| 62-249408 | 10/1987 | Japan . |
| 63-311645 | 12/1988 | Japan . |
| 63-316344 | 12/1988 | Japan . |

OTHER PUBLICATIONS

Schroder, Klaus, Stress operated random access, high speed magnetic memory, J. Appl. Phys. 53 (Mar. 1982).

*Primary Examiner*—Rolf Hille
*Assistant Examiner*—David Ostrowski
*Attorney, Agent, or Firm*—Perman & Green

[57] ABSTRACT

A data storage system is described which includes a magnetostrictive, anisotropic, ferromagnetic film whose domains exhibit a preferred orientation and are initially poled in one direction along the preferred orientation. A field is applied in opposition to the one direction, the field being insufficient to cause a switching of the poled domains. An electrostrictive film is placed in contact with the ferromagnetic film and a writing system is provided to actuate the electrostrictive film to impart stresses to the ferromagnetic film at selected locations. The induced stresses reduce the anisotropy energy of the ferromagnetic film at the selected locations and enable the domains thereat to become poled in accordance with the applied field. In one version of the invention, the writing means comprises a directed energy beam such as a laser or electron beam. In another version, the writing system employs surface acoustic waves in combination with a scanned energy beam.

10 Claims, 2 Drawing Sheets

MAGNETOSTRICTIVE/ELECTROSTRICTIVE THIN FILM MEMORY

FIELD OF THE INVENTION

This invention relates to optical storage systems, and more particularly, to magneto-optical storage system that includes both electrostrictive and magnetostrictive elements to enable improved memory operation.

BACKGROUND OF THE INVENTION

In many optical storage systems that employ magnetic materials, data is represented by magnetized domains. The direction of magnetization of the domains is generally perpendicular to the plane of the medium which is, in turn, a thin magnetic film. Data is read from the medium using a magneto-optical effect, i.e., a shift of polarization direction of a light beam when it encounters the magnetized medium. The polarization shift is a function of the direction of magnetization of the domain. Thus, by sensing reflected polarized light, the identity of a bit can be determined.

The magnetic film is initialized during manufacture by applying a field to magnetize it in one direction. Bits are written by heating selected areas of the film above its Curie point $T_c$ and then cooling the areas in the presence of an orienting magnetic field. The coercive force within the film (the field that keeps the domains in place and stable in size), decreases with increasing temperature, as $T_c$ is approached. This writing technique is known as thermomagnetic writing.

The magnitude of the orienting magnetic field is adjusted so that it can only overcome the film's coercive forces when the material is heated to approximately $T_c$. Selective heating is achieved through the use of a laser beam, electron beam or other directed energy beam.

One problem with ferromagnetic writing of magneto/optical memory cells is the time required to heat a bit position to $T_c$. Generally, a ferromagnetic film is chosen with a $T_c$ as close to room temperature as possible to speed up the write process and to allow the use of a lower power addressing beam. This allows the writing speed to be increased, decreases the required beam power, and avoids heating of the magnetic material to a level where the material is irreversibly damaged and loses its magnetic properties. The drawback of using a material with a $T_c$ close to room temperature is that the magneto-optic rotation of the domain is reduced and, as a result, the amount of induced polarization shift during the read process is similarly reduced.

The prior art is replete with references relating to various magneto-optical data storage systems.

In U.S. Pat. No. 3,949,387 to Chaudhari et al., a beam addressable system is described using a ferromagnetic write procedure. A variety of ferromagnetic amorphous magnetic compositions are described that enable high levels of uniaxial anisotropy to be obtained. In U.S. Pat. No. 4,649,519 to Sun et al., a bilevel storage media is described wherein a ferrimagnetic film is used to bias a ferromagnetic layer during a write action. The ferromagnetic layer is heated above its Curie temperature and when it cools, the biasing layer applies a fringe field which aids in the reorientation during cooling.

In U.S. Pat. No. 4,731,754 to Odgen, a Polyvinyl fluoride (PVF) ferroelectric with a $T_c$ lower than its melting point is employed as the storage media. A laser beam heats the PVF film and a bias layer causes the film to selectively orient in the heated areas. In U.S. Pat. No. 4,794,560 to Bell et al., a three layer magneto-optic recording media is shown wherein an intermediate thermal isolation layer is positioned between two magnetic layers. This structure enables one layer to be utilized as an orienting layer while the other is selectively heated. The fringe field from the orienting layer then causes a preferred direction of reorientation, upon cooling.

In Japanese patent 63-316,344, a three layer magneto-optic recording system is shown, with a first layer comprised of a soft magnetic material with a high $T_c$; a second layer including a vertically magnetized thin film with a lower $T_c$ temperature; and a third vertically magnetized recording layer. The first and second layers are employed as aligning layers, in that, upon cooling one material reorients before the other. In Japanese patent 63-311645, a two layer magneto-optic recording system is shown, again using a bias medium for domain orientation.

While the prior art employs thermal means to modify a coercive field in a ferromagnetic memory film, other physical actions have been used to effect the coercive field, e.g., stress waves. Such a system is described in "Stress-operated Random Access, High-Speed Magnetic Memory" by Schroder, Journal of Applied Physics, Vol. 53, No. 3 March 1982, pages 2759-2761. The memory disclosed by Schroder includes a checkerboard grid of stress-wave transducers, each transducer coupled to two lines of conductors. The grid is perpendicular and a magnetic block is placed on the top of each transducer. A magnetic field is applied to the system of magnetic blocks and is somewhat smaller than their coercive field.

When a transducer in Schroder's system generates a stress within a magnetic block, the magnetic dipoles in the block align parallel to an applied field. If the induced stress is high enough, it enables a "writing" to occur.

Thin film memories have also been operated employing induced stresses and one such is shown in Japanese patent 62-249,408 wherein a ferromagnetic thin film is selectively stressed to provide magnetic anisotropy after the formation of the film. This patent's use of stress is not for the actual storage procedure but for the initial polarization of the memory material.

A further method for writing into a magneto-optical memory is described in "Magnetoptic Direct Overwrite Using a Resonant Bias Coil" by D. Rugar, IEEE Transactions on Magnetics, Vol. 24, No. 1, January 1988, pp. 666-669. A sinusoidal bias field is generated by an LC coil. Domains of either sign are then written by timing laser pulses with either positive or negative peaks of the bias field.

The following articles appear in the MRS BULLETIN, Vol. 15, No. 4, April 1990 and are useful in understanding the state-of-the-art relative to magneto-optical storage: Optical Storage Disk Technology, by Gambino, pages 20-22, "Materials Challenges and Integrated Optical Recording Heads", by Weller-Brophy et al., pages 25-30, and "Magneto-Optical Storage Materials", by Greidanus et al., pages 31-39.

Accordingly, it is an object of this invention to provide an improved magneto-optic thin film memory.

It is another object of this invention to provide an improved magneto-optic thin film memory with improved levels of signal output.

It is still another object of this invention to provide a higher speed magneto-optic thin film memory that employs ferromagnetic writing.

SUMMARY OF THE INVENTION

A data storage system is described which includes a magnetostrictive, anisotropic, ferromagnetic film whose domains exhibit a preferred orientation and are initially poled in one direction along the preferred orientation. A field is applied in opposition to the one direction, the field being insufficient to cause a switching of the poled domains. An electrostrictive film is placed in contact with the ferromagnetic film and a writing system is provided to actuate the electrostrictive film to impart stresses to the ferromagnetic film at selected locations. The induced stresses reduce the anisotropy energy of the ferromagnetic film at the selected locations and enable the domains thereat to become poled in accordance with the applied field. In one version of the invention, the writing system comprises a directed energy beam such as a laser or electron beam. In another version, the writing system employs surface acoustic waves in combination with a scanned energy beam.

DETAILED DESCRIPTION OF THE INVENTION

Figure 1:
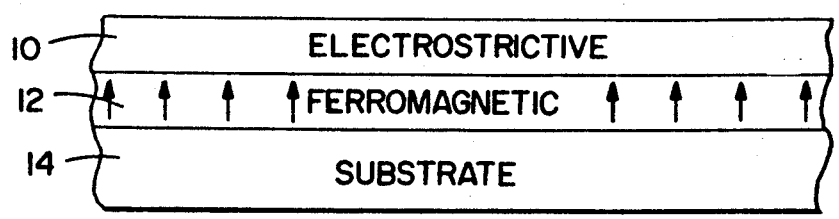
FIG. 1 is a cross section of a magneto optic storage medium that incorporates the invention hereof.

Referring now to FIG. 1, a cross section is shown of a storage medium incorporating the invention. The medium includes an electrostrictive layer 10 positioned on a ferromagnetic film 12, both of which are mounted on a substrate 14.

Electrostrictive layer is preferably ferroelectric in nature and exhibits a large spontaneous electrostriction.

Ferromagnetic film 12 preferably exhibits a large magnetostriction effect. Ferromagnetic film 12 is a square loop material with a perpendicular easy axis anisotropy. A suitable material for film 12 is an amorphous, rare-earth transition metal alloy of the type disclosed by Chaudhari et al., in U.S. Pat. No. 3,949,387. It is initialized during manufacture by a magnetic field sufficient to saturate it, so that it retains its perpendicular anisotropy. The coercive field of the ferromagnetic medium is typically one to two kilo Oersteds ($2kO_e$) so a relatively large field is required to initialize it.

As above stated, electrostrictive layer 10 is preferably ferroelectric. A solid solution of $PbZrO_3$-$PbTiO_3$ (frequently called PZT) is a suitable ferroelectric. The PZT can be deposited as a film by sputtering or by sol-gel methods. In a ferroelectric material, dipoles within certain of its crystals spontaneously become polarized (i.e., aligned and parallel) under the influence of an externally applied electric field. Those dipoles remain polarized after the field is removed. Reversal of the field can cause spontaneous polarization or alignment of the dipoles in the opposite direction. Ferroelectric materials thus have two stable polarization states and further, exhibit the propensity to lose the ferroelectric property when heated above their critical temperature, $T_{cr}$.

In order for a ferroelectric film to have the required properties, it must be in a crystalline state. If the film is deposited by sputtering onto a substrate held at room temperature, the resulting film has an amorphous structure and does not have the required ferroelectric property. If the film is subsequently annealed at approximately 600 degrees C for about one hour, the film will crystallize and acquire ferroelectric properties. Alternatively, a crystalline PZT film can be deposited by heating the substrate on which the material is deposited to about 600 degree C.

As indicated in the Background Of The Invention, a problem with prior art ferromagnetic recording media has been their relatively low $T_c$'s. This has resulted in less than optimum signal strengths during the read action. It has been found that by selecting an electrostrictive film that exhibits a $T_{cr}$ less than a higher $T_c$ juxtaposed ferromagnetic film and, in addition, employing induced stress to aid in overcoming the coercive field in the ferromagnetic film, an improved memory operation is achieved. In other words, a ferromagnetic film exhibiting a $T_c$ substantially higher than ambient can be employed, with the electrostrictive film and the stress it induces overcoming the affect of the higher $T_c$.

A laser beam is used to "write" into the memory media of this invention. When the laser beam heats electrostrictive layer 10, the selectively heated area therein expands and creates a lateral stress in the plane of underlying ferromagnetic layer 12. The induced stress reduces the effect of the coercive field on the heated domains in layer 12. The combined stress/heating action on ferromagnetic layer 12 thus causes a reorientation of the domains in the immediate vicinity of the stressed area and enables the domains, upon cooling, to reorient in accordance with a bias field.

Figure 2:
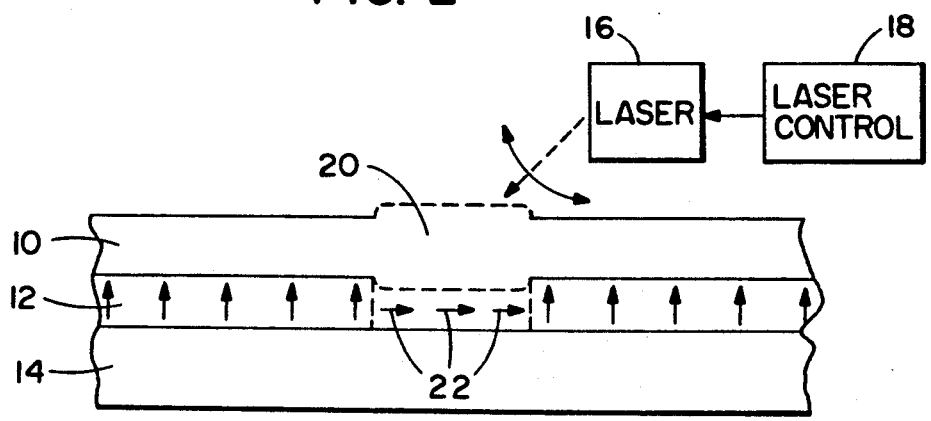
FIG. 2 is a sectional view of the magneto-optic recording medium of FIG. 1 during an initial phase of a write action.
Figure 3:
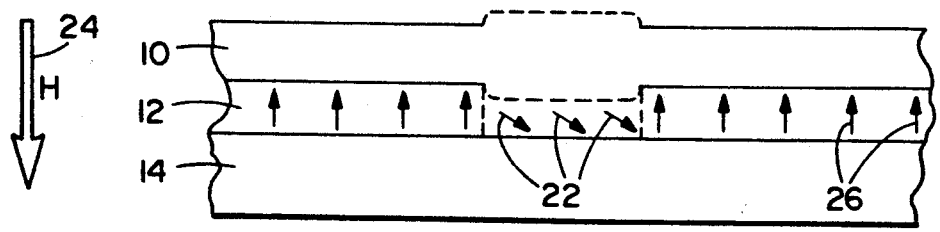
FIG. 3 is a cross section of the magneto-optic material during an intermediate phase of the write action.
Figure 4:
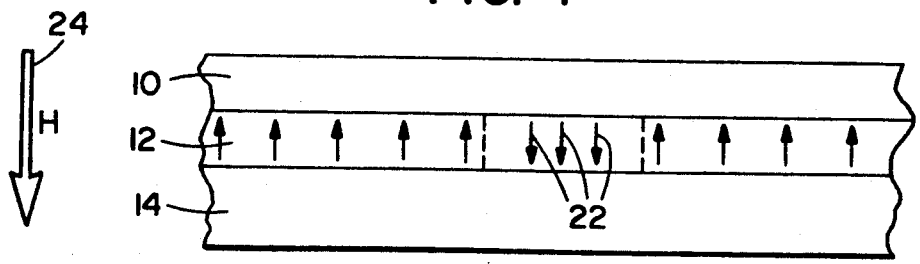
FIG. 4 is a sectional view of the magneto-optic material at the termination of the write action.

Referring now to FIGS. 2-4, the detailed operation of the memory will be described. A laser 16 and laser control 18 are employed in the known manner to perform localized addressing/heating actions.

The beam from laser 16 is focused onto region 20 of electrostrictive film 10, and it is held in place for a period of time sufficient to heat area 20 to its $T_{cr}$. It will be recalled that the $T_{cr}$ of electrostrictive film 10 is lower than the $T_c$ of ferromagnetic layer 12. When region 20 reaches its $T_{cr}$, its lattice constant experiences an abrupt change. For instance, if electrostrictive layer 10 is a ferroelectric PZT, its lattice constant increases abruptly at 120° C. by one part in 4000. At $T_{cr}$, therefore, electrostrictive layer 10 stresses ferromagnetic layer 12 in the interface area immediately beneath region 20. This planar stress reduces the effect of the coercive field in layer 12 and, in combination with the heating, induces a change in the magnetic anisotropy in layer 12 which is enough to enable the magnetized domains to turn into the plane of material 12. This is illustrated by domains 22 in ferromagnetic layer 12. If a magnetic field 24 (see FIG. 3) is then applied across the recording medium, domains 22 tend to orient in the direction thereof. The strength of magnetic field 24 should be less than that required to reorient domains 26, absent heating/stress.

When the laser beam is then removed and the medium allowed to cool, domains 22 align along the direction of field 24 and a "1" has been written. It can thus be seen that a write action occurs without the need to heat ferromagnetic layer to its $T_c$, thereby enabling a higher speed write to occur and enabling the use of a high $T_c$ magnetic layer. The high $T_c$ magnetic layer has a higher magneto-optic rotation at room temperature and thus gives a higher signal to noise ratio. Reading can occur magnetooptically, as in the prior art.

In the structure shown in FIGS. 1-4 substrate 14 is typically a refractory glass such as fused silica. Ferromagnetic layer 12 is preferably a ferrimagnetic garnet exhibiting a large magnetostriction as well as a large magneto-optic rotation. Electrostrictive layer 10 is preferably a PZT which is ferroelectric.

The conditions for preparing a garnet film are similar to those used for the preparation of a PZT.

An amorphous film of garnet is initially sputter deposited as an amorphous film. The film is then annealed at approximately 600° C. This can be accomplished in a conventional furnace or by means of a rapid thermal anneal with a radiant heater.

Figure 5:
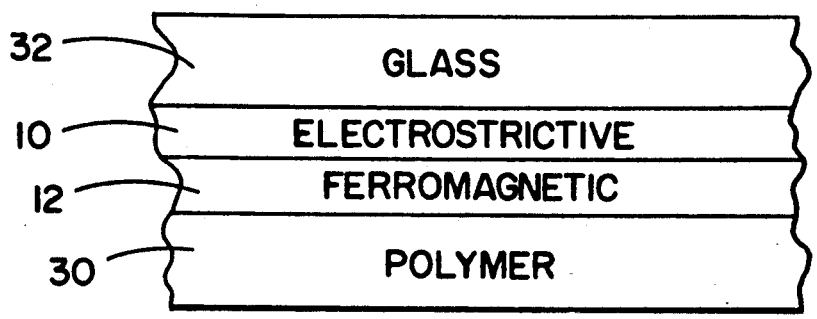
FIG. 5 is a cross section of a further embodiment of the magneto-optic recording material.

Referring now to FIG. 5, a cross section of another configuration is shown of a magneto-optic memory, incorporating the invention. In the cross section shown in FIG. 5, electrostrictive layer 10 and ferromagnetic film 12 are encompassed on one side by a transparent polymeric coating 30 (such as a low birefringence polycarbonate polymer), and on the other side by a refractory glass substrate 32. Ferromagnetic film 12 preferably exhibits a large magnetostriction effect; may comprise Tb 20, Fe 20, Co 60; and typically be approximately 0.1 microns thick. Electrostrictive film 10 is preferably a PZT with a $T_{cr}$ that is lower than the $T_c$ of ferromagnetic layer 12. The $T_{cr}$ of PZT is 350° C. whereas the $T_c$ is 400° to 500° C. The $T_c$ of the ferromagnetic layer can be adjusted between wide limits, from room temperature to about 1000° C., in amorphous and crystalline Gd-Co alloys.

The structure shown in FIG. 5 is fabricated by depositing electrostrictive film 10 onto a refractory glass disk. A solid solution of $PbZrO_3$-$PbTiO_3$ (PZT) is a suitable ferroelectric. In order for the film to have the required ferroelectric properties, it must be in a crystalline state. If the film is deposited by sputtering at room temperature, the resulting film has an amorphous structure and does not exhibit the required ferroelectric properties. By annealing the film at approximately 600° C. for about one hour, the film will crystallize and acquire ferroelectric properties. Alternatively, a crystalline PZT film can be deposited by heating the substrate during deposition to approximately 600° C.

Ferromagnetic layer 12 can also be deposited by sputtering. It has the needed magnetic properties when it is in the amorphous state. Glass substrate 32 is maintained at room temperature during deposition to obtain an amorphous ferromagnetic film. Subsequently, ferromagnetic film 12 must not be heated above its crystallization temperature either during processing or operation of the device. The crystallization temperature is typically about 400° C. In the prior art the Curie temperature ($T_c$ which depends on composition had to be lower than the crystallization temperature. In this invention the Curie temperature ($T_c$) of a ferromagnetic film 12 will depend somewhat on its composition, but is typically in the 400°-500° C. range.

Ferromagnetic layer 12 is coated with a low birefringence polymer such as a polycarbonate copolymer. Coating 30 should be at least about 1 millimeter thick so that dust particles or other blemishes on the surface of the coating are not in focus and do not cause spurious signals when a laser beam is directed therethrough. Polymer coating 30 may be applied by injection molding, photopolymerization or spin coating.

The structure shown in FIG. 5 may contain other material layers for improved chemical stability or for improved optical properties. For example, a platinum layer may by deposited on glass substrate 32 during the annealing process. Also dielectric coatings may be used between ferromagnetic layer 12 and polymer layer 30. A dielectric layer can serve as the reflection coating and can also help prevent impurities (e.g. $H_2O$) from reacting with the ferromagnetic layer.

Figure 6:
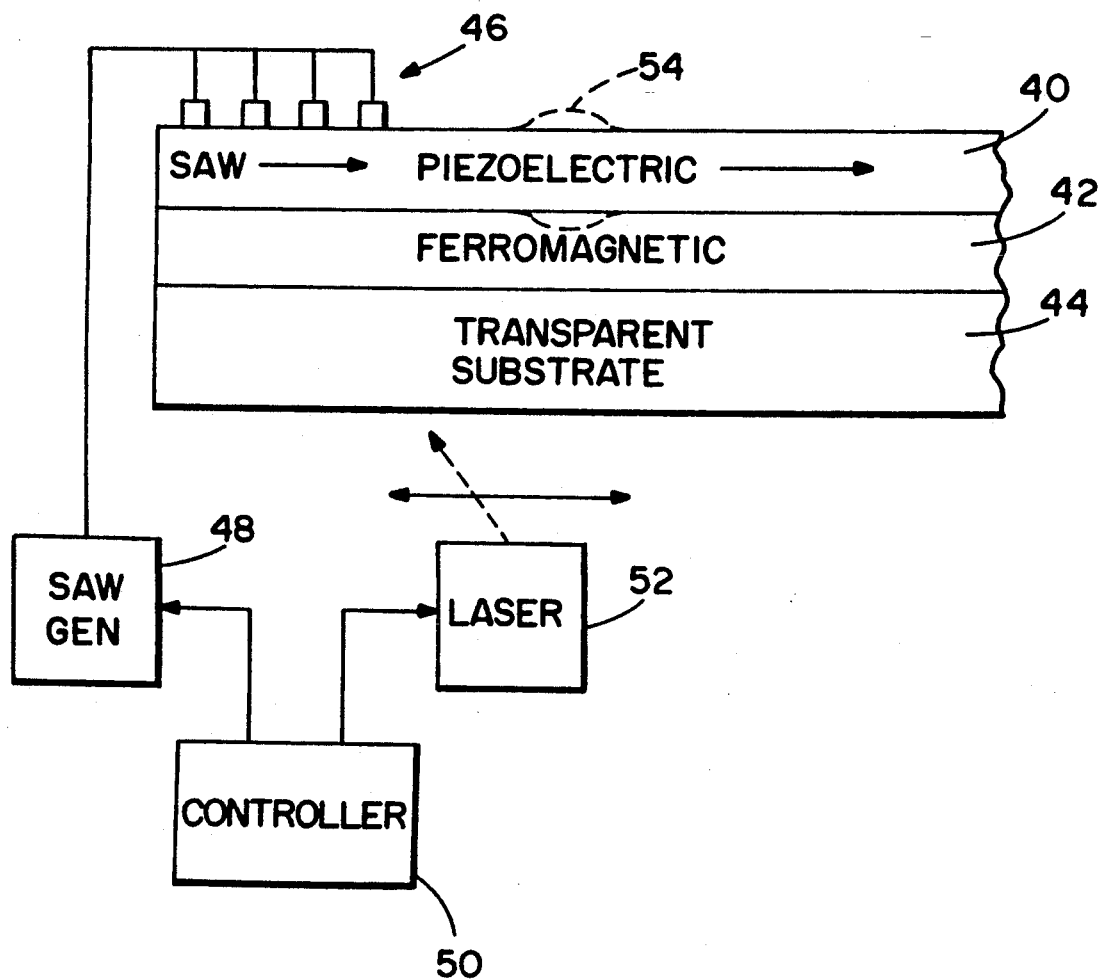
FIG. 6 is a combined, block diagram/sectional view of another embodiment of the magneto-optic record system wherein a surface acoustic wave is employed to aid the ferromagnetic writing action.

Referring now to FIG. 6, a modified magneto-optic memory system is shown wherein a surface acoustic wave is used to induce a stress in a juxtaposed ferromagnetic layer at the same time a laser is used to raise the layer above its Curie temperature. In particular, a piezoelectric layer 40 sandwiches a ferromagnetic layer 42 between itself and a transparent substrate 44. On the upper surface of piezoelectric layer 40, a set of interdigitated conductive fingers 46 are positioned which are, in turn, connected to a surface acoustic wave (SAW) generator 48. A controller 50 synchronizes the wave generated by SAW generator 48 and the gating and scanning action of laser 52.

In this instance, instead of heating piezoelectric layer 40, the heating effect is applied directly to ferromagnetic layer 42. By gating laser 52 "on" as it is incident on a selected area, that area is raised to a temperature somewhat below its $T_c$. Then, when a surface acoustic wave 54 propagates down the length of piezoelectric layer 40, it applies a stress to the heated area, reduces its anisotropy energy and allows the domains in that region to align along its plane. A magnetic field (not shown) is either simultaneously or subsequently applied to influence the direction of reorientation of the rotated domains so as to accomplish the writing action.

Through appropriate design of piezoelectric layer 40 and SAW transducer 46, standing waves can be induced in layer 40 which selectively apply stress to lateral areas across the surface of ferromagnetic layer 42. By scanning laser 52 selected regions within ferromagnetic layer 42 can then be heated and data written therein.

The structure shown in FIG. 6 can be fabricated without high temperature processing. Transparent substrate 44, typically a polymer-like polycarbonate, is coated with a ferromagnetic thin film 42. Such a film can be deposited by sputtering at ambient. A piezoelectric polymer, (e.g. PVF) that is available in the form of thin sheets which can be laminated to ferromagnetic thin film 42 with pressure and gentle heating at about 50° C. An example of such a commercial polymer is polyvinyl diflouride (PVDF). For acceptable piezoelectric properties, this material must be partly crystallized, oriented and poled within an electric field. Suitable conductor patterns can then be applied by ambient temperature processes.

While the invention has been particularly shown and described with respect to a preferred embodiment thereof, it will be understood by those skilled in the art that changes in form and details may be made therein without departing from the scope and spirit of the invention.

What is claimed is:

1. A data storage system comprising:
   a magnetostrictive ferromagnetic film having a preferred direction anisotropy and a Curie temperature $T_c$, domains in said film initially poled in one direction along said preferred direction;
   means for applying a field in opposition to said one direction;
   an electrostrictive film in contact with said ferromagnetic film; writing means for actuating said electrostrictive film to impart stresses to said ferromagnetic film at selected locations to reduce anisotropy energy of said ferromagnetic film at said selected locations, said actuating causing a heating of said ferromagnetic film to a temperature less than said $T_c$ to enable domains only at said selected locations to become poled in accordance with said applied field.

2. The data storage system of claim 1 wherein said preferred direction is generally perpendicular to a planar dimension of said ferromagnetic film and said electrostrictive film imparts said stresses to said ferromagnetic film generally in an orientation that is in the plane of said planar dimension.

3. The data storage system of claim 2 wherein said electrostrictive film is a ferroelectric.

4. The data storage system of claim 3 wherein the Curie temperature of said ferroelectric film is less than the Curie temperature of said ferromagnetic film and said writing means is a directed energy beam that heats said selected locations to at least the Curie temperature of said ferroelectric film.

5. The data storage system of claim 4 further comprising:
   control means for operating said directed energy beam to apply said beam to said selected areas only long enough to cause the Curie temperature of said ferroelectric film to be reached, but not long enough to cause the temperature at said selected locations to reach the Curie temperature of said ferromagnetic film.

6. The data storage system of claim 5 wherein said directed energy beam is a laser beam.

7. The data storage system of claim 5 further comprising:
   a substrate for supporting said ferroelectric film, said substrate transparent to said directed energy beam.

8. The data storage system of claim 7 further comprising a protective polymeric film on said ferromagnetic film, said polymeric film and substrate sandwiching therebetween said ferromagnetic and ferroelectric films.

9. The data storage system of claim 2 wherein said writing means includes means for inducing surface acoustic waves in said electrostrictive film, and further comprises:
   energy beam means for heating selected areas of said ferromagnetic film in synchronism with the application of said induced acoustic waves to said electrostrictive film, whereby said selected areas become poled in accordance with said applied field.

10. The data storage means of claim 9 wherein said electrostrictive film exhibits piezoelectric properties and said means for inducing acoustic waves comprises a plurality of conductive, interdigitated fingers emplaced on said electrostrictive film.

* * * * *